United States Patent
Kiers et al.

(10) Patent No.: US 7,596,420 B2
(45) Date of Patent: Sep. 29, 2009

(54) DEVICE MANUFACTURING METHOD AND COMPUTER PROGRAM PRODUCT

(75) Inventors: Antoine Gaston Marie Kiers, Veldhoven (NL); Johannes Anna Quaedackers, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 395 days.

(21) Appl. No.: 11/455,240

(22) Filed: Jun. 19, 2006

(65) Prior Publication Data

US 2007/0293973 A1 Dec. 20, 2007

(51) Int. Cl.
G06F 19/00 (2006.01)
G06F 17/50 (2006.01)
G06F 11/00 (2006.01)
G03F 1/00 (2006.01)
G03C 5/00 (2006.01)
H01L 21/82 (2006.01)
G05B 13/02 (2006.01)
H05G 1/60 (2006.01)
G02F 1/1335 (2006.01)

(52) U.S. Cl. .............................. 700/121; 430/5; 430/30; 438/129; 700/13; 700/44; 700/45; 700/120; 700/125; 703/13; 714/30; 714/31; 716/20; 378/34; 977/887; 349/4

(58) Field of Classification Search ................. 700/121, 700/13, 44, 45, 120, 125; 716/20; 703/13; 714/30, 31; 430/5, 30; 438/129; 378/34; 977/887; 349/4

See application file for complete search history.

(56) References Cited

U.S. PATENT DOCUMENTS

| 5,663,076 | A   | * | 9/1997  | Rostoker et al. ............... 438/14 |
| 6,643,596 | B2  | * | 11/2003 | Firth et al. ..................... 702/84 |
| 6,665,856 | B1  | * | 12/2003 | Pierrat et al. .................. 716/19 |
| 6,913,938 | B2  | * | 7/2005  | Shanmugasundram et al. ............................ 438/16 |
| 7,131,101 | B2  | * | 10/2006 | Pierrat et al. .................. 716/19 |
| 2002/0091986 | A1 | * | 7/2002  | Ferguson et al. .............. 716/19 |
| 2005/0136346 | A1 | * | 6/2005  | Ottens et al. .................. 430/30 |

OTHER PUBLICATIONS

Mircea Dusa, et al., "Intra-Wafer CDU Characterization to Determine Process and Focus Contributions Based on Scatterometry Metrology", Proceedings of SPIE vol. 5378 (2004), pp. 93-104.
J.L. Opsal, et al., "Real-Time Optical CD Metrology for Litho Process", Proceedings of SPIE vol. 5038 (2003), pp. 496-507.

(Continued)

*Primary Examiner*—Ramesh B Patel
*Assistant Examiner*—Thomas H Stevens
(74) *Attorney, Agent, or Firm*—Pillsbury Winthrop Shaw Pittman LLP

(57) ABSTRACT

A method is provided wherein a lithographic projection apparatus is used to print a series of test patterns on a test substrate to measure printed critical dimension as function of exposure dose setting and focus setting. A full-substrate analysis of measured critical dimension data is modeled by a response model of critical dimension. The response model includes an additive term which expresses a spatial variability of the response with respect to the surface of the test substrate. The method further includes fitting the model by fitting model parameters using measured critical dimension data, and controlling critical dimension using the fitted model.

20 Claims, 7 Drawing Sheets

OTHER PUBLICATIONS

Christopher P. Ausschnitt, et al., "Process Window Metrology", Proceedings of SPIE vol. 3998 (Mar. 2000), pgs. 158-166.

Chris A. Mack, et al., "Improved Model for Focus-Exposure Data Analysis", Proceedings of SPIE vol. 5038 (2003), pp. 396-405.

Jangho Shin, et al., "Advanced Module-Based Approach to Effective CD Prediction of Sub-100 nm Patterns", Proceedings of SPIE vol. 5378 (2004), pp. 65-73.

Terrence E. Zavecz, "Full-Field Feature Profile Models in Process Control", Proceedings of SPIE vol. 5755 (May 2005), pp. 126-137.

Paul Friedberg, et al., "Spatial Modeling of Micron-Scale Gate Length Variation", Proceedings of SPIE vol. 6155 (Mar. 2006), pp. 61550C-1-61550C-12.

Paul D. Friedberg, et al., "Time-Based PEB Adjustment for Optimizing CD Distributions", Proceedings of SPIE vol. 5375 (2004), pp. 703-712.

* cited by examiner $$E = E_0 + r_1 \cdot CH_E$$
$$F = F_0 + r_2 \cdot CH_F$$

DEVICE MANUFACTURING METHOD AND COMPUTER PROGRAM PRODUCT

FIELD

The present invention relates to a method for manufacturing a device using a lithographic apparatus and a computer program product.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer).

The radiation system as well as the projection system of a lithographic apparatus generally comprise components to direct, shape or control a beam of radiation. Generally, the projection system comprises means to set the numerical aperture (commonly referred to as the "NA") of the projection system. For example, an adjustable NA-diaphragm may be provided in a pupil of the projection system. The radiation system typically comprises adjusting means to set the outer and/or inner radial extent (commonly referred to as σ-outer and σ-inner, respectively) of the intensity distribution upstream of the patterning device (in a pupil of the radiation system).

Fabrication of an integrated circuit pattern involves the control of space tolerances between features of the pattern, as well as control of feature dimension tolerances. In particular the control of tolerances of the smallest dimensions (such as for example the size of contacts or the width of lines or of spaces between two lines of a dense line space pattern) permitted in the fabrication of the integrated circuit device is of importance. The size of these most critical dimensions is referred to as the critical dimension ("CD"). Features having such a critical dimension may, hereinafter, be referred to as CD-sized features.

A measurement of a cross sectional profile in resist (the "resist profile") of a feature or of a plurality of features may be used to obtain a measured value of the printed CD or a set of measured values of printed CD. In the present context, the printed CD refers to the dimension of a feature as obtained after post-exposure processing of an exposed resist layer.

With conventional projection lithographic techniques, an occurrence of a variance in printed CD may limit the process latitude or process window (i.e., the available depth of focus in combination with the allowed amount of residual error in the dose of exposure of irradiated target portions for a given tolerance on CD). The variance of printed CD arises because features of the patterning device having the same nominal critical dimensions may print differently depending on, for example, an amount of defocus (out of a plane of best focus) of the part of the target portion where the feature is imaged, due to, for example, substrate topography, image curvature or substrate unflatness.

The effect of focus on CD with a projection lithography printing process is a significant part in understanding and controlling the lithographic process. A change in focus not only alters the resist profile of a feature, but also increases the sensitivity of the resulting printed CD to other processing errors. For example, residual exposure-dose variations during a full substrate exposure may occur due to scan speed variations in a scanner apparatus. Since the effect of focus depends on exposure dose, a conventional method to judge the response of printed CD to focus and dose deviations is to execute a number of exposures of a test pattern including CD-sized features on a test substrate, whereby the different exposures are run at corresponding different combinations {E,F} of lithographic apparatus exposure-dose setting E and substrate focus-position setting F.

After completion of the different exposures, the test substrate is processed (including, for example a post-exposure bake step and a resist development step) and measurements of the printed CD can be done for each combination {E,F} of exposure dose and focus. The obtained measurement data representing a response of printed CD to exposure dose settings and focus settings of the lithographic apparatus can be visualized graphically. A response of printed CD to exposure dose setting and focus setting is, hereinafter, denoted by a function CD(E,F). Data describing such a dependency CD(E, F) of printed CD on exposure dose setting and focus setting are generally represented by a plot of printed CD (along a vertical axis) versus focus setting F (along a horizontal axis), for a constant exposure dose E. The corresponding curve or plot is referred to as a Bossung curve or plot.

From a series of Bossung plots with a corresponding series of exposure doses as parameter, important metrics for characterization of the lithographic process, when run on the lithographic apparatus, may be derived. Such metrics are, for example, the depth of focus ("DOF") and the process window. Further, by including both dense and isolated CD-sized features in the test pattern, a measure for iso-dense bias may be obtained. Iso-dense bias refers to a difference in printed CD between two similar features such as lines arranged at two respective, different pitches.

Generally, a patterning device pattern is designed in such a way that differences in dimensions of printed isolated features and printed dense features are minimized to some degree, by applying a size bias to certain features. Applying, to the patterning device pattern, a size bias to certain features such as lines is referred to as feature-biasing and, in the case of lines, as line-biasing. The actual pitch dependency of printed CD depends, however, on the specific properties of the lithographic apparatus, such as for example projection system optical wave aberrations and settings of the apparatus such as the focus and exposure dose settings. Therefore, even in the presence of feature bias, a residual iso-dense bias may be present.

In view of the trend in the field of lithography to provide increasing numbers of features per area on the substrate, CD tolerance budgets are decreasing. Consequently a method of control of CD variations and iso-dense bias should be improved.

Conventionally, a response CD(E,F) of printed CD to changes $CH_E$ and $CH_F$ of respective preselected exposure dose and focus settings $E_0$ and $F_0$ is modeled as a power series in the changes $CH_E$ and $CH_F$. In such a model the response CD(E,F) is given by $$CD(E, F) = \sum_{i,j}^{I,J} C_{a;ij} CH_E^i CH_F^j \quad (1)$$

where $$CH_E = E - E_0 \quad (2)$$
$$CH_F = F - F_0$$

and where $C_{a;ij}$ are model parameters. The powers i and j run from zero up to respective preselected values I and J.

It should be appreciated that $F_0$ may for example be a first estimate of a best focus position BF of the substrate along the optical axis of the projection system. Similarly, the exposure dose $E_0$ may be a first estimate of the best exposure dose needed to print a CD-sized feature at its nominal size. In accordance with Equation (1) a model of printed CD as a function of exposure dose and focus position is defined by a set of model parameters $C_{a;ij}$, the set being denoted as S $\{C_{a;ij}\}$.

A known method to control printed CD comprises utilizing exposure energy E and focus setting F as settable variables to affect CD. For example an effect of focus drift may be compensated by applying a focus offset to the lithographic apparatus. These techniques use models as described above in a control algorithm that relates exposure dose E and focus F to printed critical dimension. For example, an explicitly known model is the model with the set of model parameters S$\{C_{a;00}, C_{a;10},$ all other $C_{a;ij}=0\}$.

Another known model includes an expansion in powers of $(1-E_0/E)^i$, instead of $CH_e^i$. See, for example, U.S. Pat. No. 6,643,596.

A known method includes a fitting of the model parameters to measured data of printed CD. The fitting involves reduction of the differences between the modeled data and the measured data for which various techniques and algorithms are available. For example, a least squares fitting can be used. The resulting "fitted" model parameters are stored and used by the control algorithm to calculate setting changes to be applied.

However, the effectiveness of the control of CD using a fitted CD response model significantly depends on the reliability of the model and the accuracy of the measurement data.

SUMMARY

It is therefore desirable, for example, to provide a method for CD control based on a CD response model with improved accuracy.

According to an aspect of the invention, there is provide a device manufacturing method comprising using a lithographic apparatus to transfer a pattern from a patterning device onto a surface of a substrate to provide a pattern of features on the substrate, the method comprising calculating a change of at least one setting of one or more apparatus settings based on a model of a response of a feature characteristic to changes of any of the one or more apparatus settings; and applying the at least one change of setting to the lithographic apparatus, wherein the model includes an additive response-model term expressing a spatial variability of the response of the feature characteristic with respect to the surface of the substrate.

According to an aspect of the invention the feature characteristic is a critical dimension of the feature, and the change of at least one setting includes a change of setting of exposure dose setting for exposing the substrate, focus setting of the substrate, or exposure dose setting and focus setting.

According to another aspect of the invention there is provided a computer program product comprising program code to control a lithographic apparatus to perform a method comprising calculating a change of at least one setting of one or more apparatus settings based on a model of a response of a feature characteristic to changes of any of the one or more apparatus settings; and applying the at least one change of setting to the lithographic apparatus, wherein the model includes an additive response-model term expressing a spatial variability of the response of the feature characteristic with respect to the surface of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
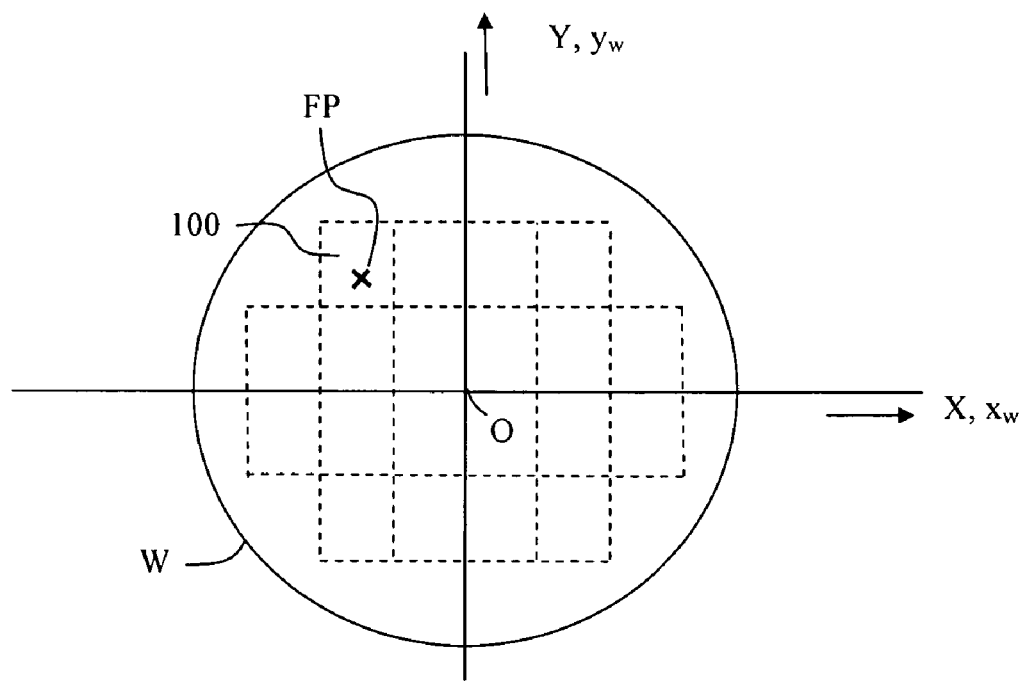
FIG. 1 depicts a substrate or test substrate and an arrangements of dies or fields on the substrate.

According to an embodiment of the present invention a method to control critical dimension in a lithographic process using a lithographic apparatus is based on a critical dimension response model with improved accuracy. The method includes calculating one or more changes of exposure-dose setting and focus position setting (for example by effecting changes of a substrate table position along an optical axis of the projection system of the apparatus) of the substrate. The calculation is preceded by a fitting of the model to measured printed CD data. Fitted model parameter values are obtained by the fitting of the model, and stored. The calculation of the setting changes is based on the stored, fitted model parameter values. The method further includes applying the one or more changes of setting to the lithographic apparatus. The response model includes in addition to a response CD(E,F) as given by Equation (1) an additive response which expresses a spatial variability of printed CD with respect to the substrate W, shown in FIG. 1. The improved model is denoted as CD(E,F, {X}) where {X} represents a set of spatial coordinates defining a position on the substrate W along X,Y axes as illustrated in FIG. 1, which depicts a layout of fields (or dies or target portions) 100 on the substrate W. The additive response is denoted by F({X}), so that $$CD(E, F, \{X\}) = F(\{X\}) + \sum_{i,j}^{I,J} C_{a;ij} CH_E^i CH_F^j. \quad (3)$$

Here, the set of coordinates {X} comprises intra-substrate coordinates {$x_w, y_w$}, see FIG. 1, for identifying a position on the substrate, independent of positions of fields 100.

The additive response F({X}) is characteristic for intra-substrate effects (for example, due to a variation of resist layer thickness over the substrate surface). Hence, the additive response F({X}) may be written as a series expansion in powers u and v (running from 0 to preselected respective maximum powers U and V) of the coordinates $x_w$ and $y_w$, with model parameters $C_{w;uv}$:

$$F(\{x_w, y_w\}) = \sum_{u,v}^{U,V} C_{w;uv} x_w^u y_w^v. \quad (5)$$

As a result, a CD response model according an embodiment of the present invention can be written as $$CD(E, F, \{X\}) = \sum_{u,v}^{U,V} C_{w;uv} x_w^u y_w^v + \sum_{i,j}^{I,J} C_{a;ij} CH_E^i CH_F^j. \quad (6)$$

According to the an embodiment it is recognized that printed CD is responsive to both pre- and post-exposure process characteristics and lithographic exposure apparatus characteristics. The latter characteristics include, for example, physical properties of the apparatus, apparatus-manufacturing tolerances and variability, and apparatus settings for running a lithographic exposure process. It shall be appreciated that a response to pre- and post-exposure process characteristics is dominated by a resulting spatial variability of printed CD with respect to the substrate. Therefore, in contrast to the model parameters $C_{a;ij}$, which by definition relate to apparatus characteristics, the model parameters $C_{w;uv}$ primarily relate to an impact on printed CD which usually is not attributable to the lithographic apparatus as such, but instead to sources of CD deviation outside the lithographic apparatus. The latter impact is, for simplicity, referred to as process-impact hereinafter, whereas the impact on printed CD of lithographic exposure apparatus characteristics is referred to as apparatus-impact.

Due to the simultaneous presence of both apparatus-impact and process-impact during exposure (to patterned beams with CD-sized pattern features) of resist on a substrate or test substrate, the CD as printed is affected by the combined impacts. The combined impact may decrease the accuracy of conventional measurements of Bossung curves, as modeled by Equation (1) (and used for in situ CD control during a lithographic single die or full-substrate exposure process).

Figure 2:
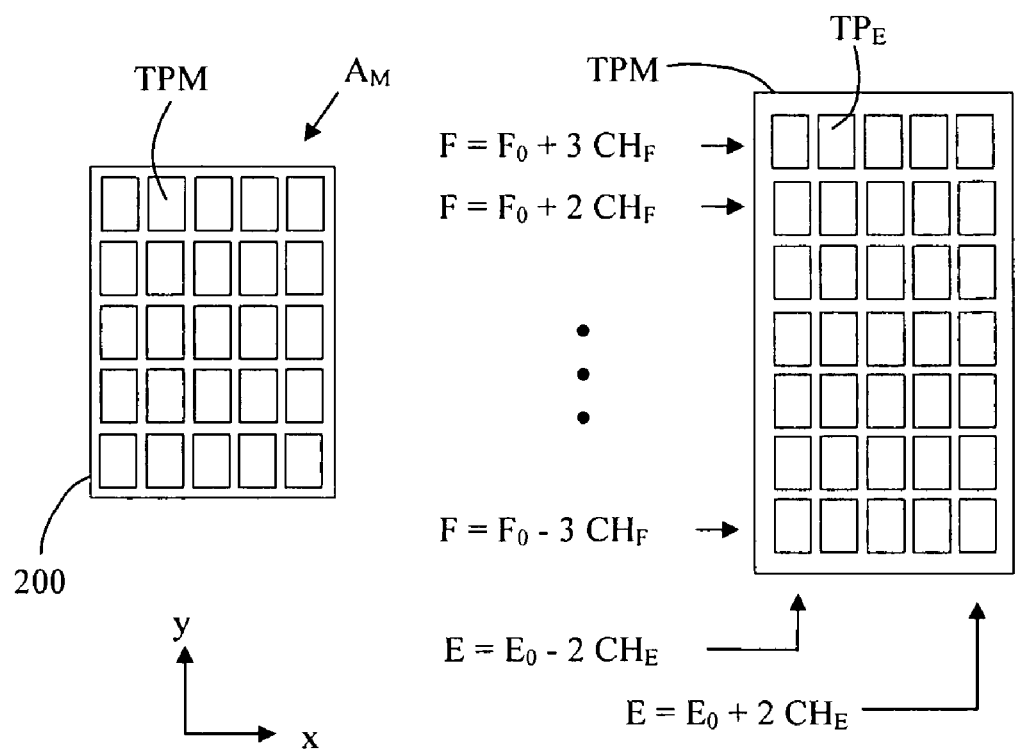
FIG. 2 depicts a test pattern used to obtain printed patterns arranged as a focus exposure matrix.

Conventional measurements of CD data for the presentation of Bossung curves involves obtaining so-called Focus Exposure Matrix data (FEM data), whereby a test substrate is coated with a resist layer and subjected to a series of exposures at a corresponding series of different combinations of exposure dose setting E and substrate focus setting F. As illustrated in FIG. 2, exposure dose settings and focus settings are arranged as series of incremental, equal setting changes $CH_E$ and $CH_F$ respectively, whereby the range of settings is arranged symmetrically around an estimated nominal exposure dose $E_0$ ("dose to size") and a nominal best focus setting $F_0$=BF. A test patterning device comprises a field-sized test-pattern 200 corresponding to a field or die. The field-sized test pattern 200 may typically include a matrix-like spatial arrangement $A_M$ of test pattern modules TPM. Each test pattern module TPM may, for example, comprise an array of 5×7 elementary test patterns $TP_E$. Each elementary test pattern $TP_E$ comprises an identical arrangement of one or more CD sized features (not shown in FIG. 2). An elementary test pattern may be embodied as a set of dedicated test pattern structures, but is not limited to such an embodiment. A pattern $TP_E$ may also simply be a part of a desired pattern of an IC device layer which is to be printed.

Figure 3:
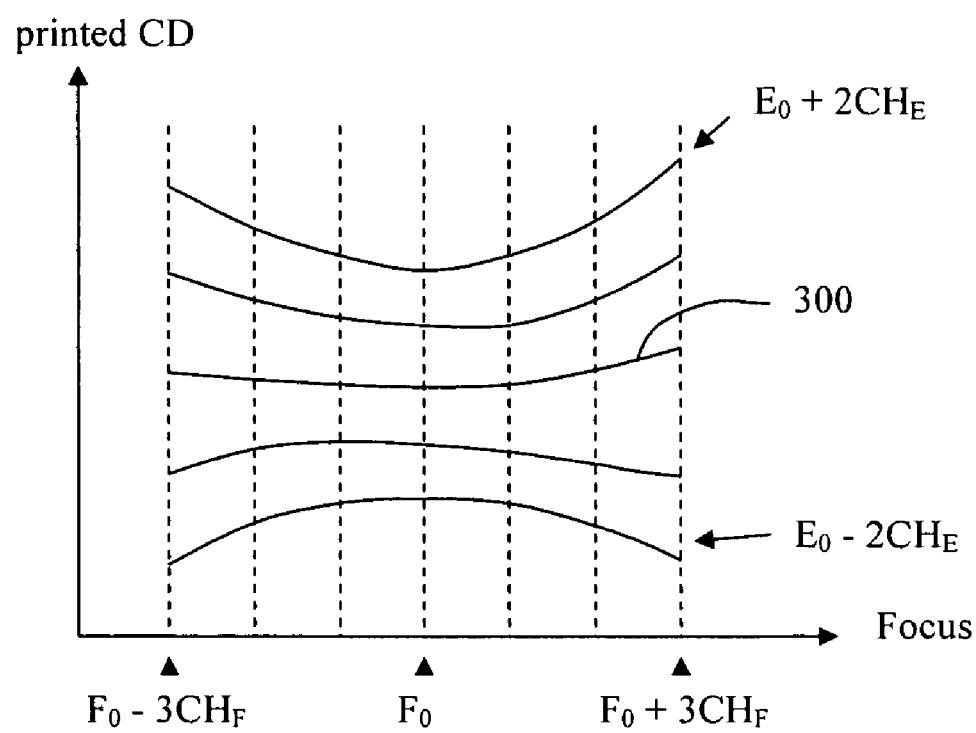
FIG. 3 depicts a typical set of Bossung curves, parameterized by exposure dose.

A single elementary test pattern $TP_E$ is exposed at a preselected exposure dose setting and focus setting {E,F}. During this exposure, patterning device masking blades may be used to avoid exposure of any other neighboring elementary test patterns $TP_E$. The different elementary test patterns $TP_E$ of a test pattern module TPM are sequentially exposed at a corresponding sequence of {E,F} settings in accordance with a sequence of equal incremental setting changes. For example, as illustrated in FIG. 2, along the x direction the exposure dose may be incremented and along the y direction the focus setting may be incremented. After post exposure processing of the test substrate, measurements of printed features at one module TPM yield CD data for 5 Bossung plots 300, as illustrated in FIG. 3. Each Bossung plot 300 is defined by 7 points along the focus-axis. Thus, 35 measurement points define 5 Bossung plots 300 illustrating a dependence of printed CD on F and E settings. Measurements of printed CD can be done at each of the different elementary test patterns $TP_E$, and for each module TPM, to obtain full intra-die CD data.

According to an embodiment it is appreciated that conventional sets of FEM data are affected by the selected spatial position at or arrangement over the substrate surface of one or more fields used for exposure of the test pattern 200. Therefore, there is a need to provide a method of separating out such a spatial variability from Bossung curve representations or from CD response data represented by CD(E,F) as given by Equation (1). According to an embodiment of the present invention such a separation is possible by a fitting of the model as given by Equation (6) using a model-parameter fitting to the measured printed CD responses at the different exposure-dose settings E and focus settings F, thereby incorporating (and thus keeping track of) the values of the intra-substrate ($x_w$, $y_w$) coordinates of the test pattern modules TPM or—if desired—of the respective elementary test patterns $TP_E$ within each die. Hence, the $C_{a;ij}$ coefficients as well as the $C_{w;uv}$ coefficients are varied to find fitted values for these coefficients, using thereto one of the conventional data-fitting techniques. The fitted values of the $C_{a;ij}$ and the $C_{w;uv}$ coefficients are denoted hereinafter by $\underline{C}_{a;ij}$ and $\underline{C}_{w;uv}$ respectively, and the predicted printed CD based on the fitted model is denoted by $\underline{CD}(E,F,\{X\})$:

$$\underline{CD}(E, F, \{X\}) = \sum_{u,v}^{U,V} \underline{C}_{w;uv} x_w^u y_w^v + \sum_{i,j}^{I,J} \underline{C}_{a;ij} CH_E^i CH_F^j. \quad (7)$$

From the fitted model the apparatus-impact characteristic part given by CD(E,F), with $$\underline{CD}(E, F) = \sum_{i,j}^{I,J} \underline{C}_{a;ij} CH_E^i CH_F^j \quad (8)$$

can be used for generation of Bossung plots and for calculating changes of exposure-dose setting and focus setting needed for the control of critical dimension during a run of a lithographic process. Subsequently, at least one calculated change of setting is applied to the lithographic apparatus.

It shall be appreciated that the present method includes measuring printed CD at a plurality of positions on the substrate, each measurement executed as described above, so that measurements of printed CD at different positions in respective different target portions or dies are included.

According to an aspect of the invention, a fitting of the model coefficients can be applied to CD measurement data obtained from the test pattern 200 as imaged in different dies or fields at a same position within each of the different dies. This enables separating out a contribution related to, for example, a spatial distribution of a patterning device pattern error.

The following steps are executed: fitting the model (i.e., fitting a predicted critical dimension response to the measured critical dimension response); calculating at least one change of exposure dose setting for exposing a substrate and a focus setting of the substrate based on the model of critical dimension response such as given by Equation (8), and applying the at least one change of setting to the lithographic apparatus.

A spatial variability of printed CD over a substantially full substrate surface can be accounted for by preselecting the different target portions or dies 100 for printing the test pattern 200 such as to substantially cover a full substrate surface of a substrate W.

Figure 4:
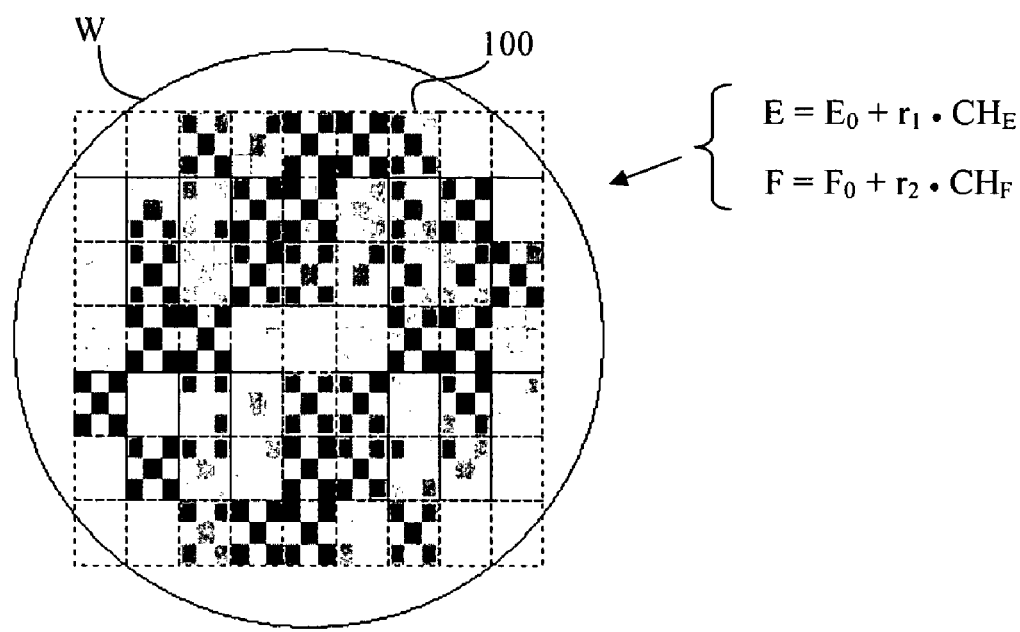
FIG. 4 illustrates a spatial distribution of measured critical dimension data in relation to a substrate surface and to exposure dose setting and focus setting.
Figure 4:
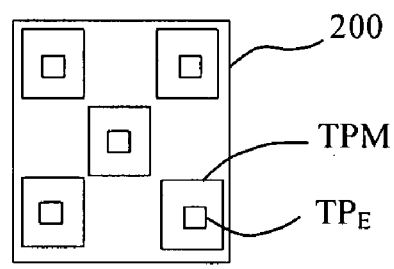

To illustrate the effect of an embodiment of the present invention over a conventional technique, predicted CD(E,F) values obtained with a fitted model of exposure-dose impact and focus-change impact on CD in accordance with an embodiment of the present invention and as given by CD(E,F) (see Equation (8)) is compared to CD(E,F) values obtained with a conventional fitted model in accordance with Equation (1) and as obtained with a conventional full substrate FEM data collection, ignoring CD spatial variability. For simplicity, and as illustrated in FIG. 4, the comparison is based on the use of a test pattern 200 wherein five test pattern modules are disposed, each test pattern module including one elementary test pattern $TP_E$. The test patterns are imaged in die areas 100 on a substrate W, and each die image is captured at a single specific set {E,F} of exposure dose setting and substrate focus setting. The setting of exposure dose E and focus F is varied spatially in accordance with $$E = E_0 + r_1 CH_E$$

$$F = F_0 + r_2 CH_F \quad (9)$$

where $r_1$ and $r_2$ are integers which, as a function of die position on the substrate W, vary randomly around a mean value zero. In FIG. 4 the grey-tone variations over the areas where the test pattern modules TPM are printed on the substrate, schematically indicate the various printed CD values as measured.

Figure 5:
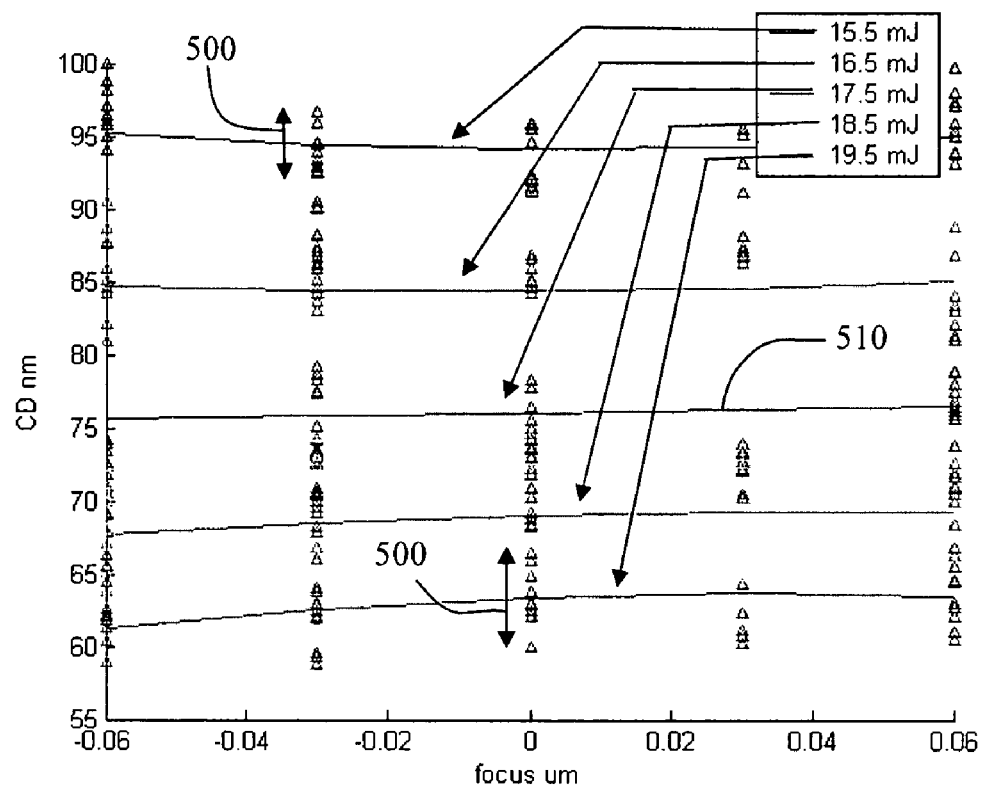
FIG. 5 illustrates a set of Bossung curves representing predicted critical dimension dependence on exposure dose and focus obtained using conventional prediction techniques and the critical dimension data of FIG. 4.

Predicted values of critical dimension as function of exposure dose E and focus F for a single preselected position in the die (i.e., for one of the elementary test patterns $TP_E$) are shown as Bossung plots 510 in FIG. 5. The CD(E,F) data represent the result of fitting parameter values of a conventional CD(E,F) model to the measured CD data (as schematically displayed in FIG. 4). Ranges 500 of CD values illustrate typical CD variations within fields on the substrate. The curves 510 in FIG. 5 result from a conventional fitting to the CD data where a linear least square fitting algorithm was used to obtained best-fit Bossung curves 510.

Figure 6:
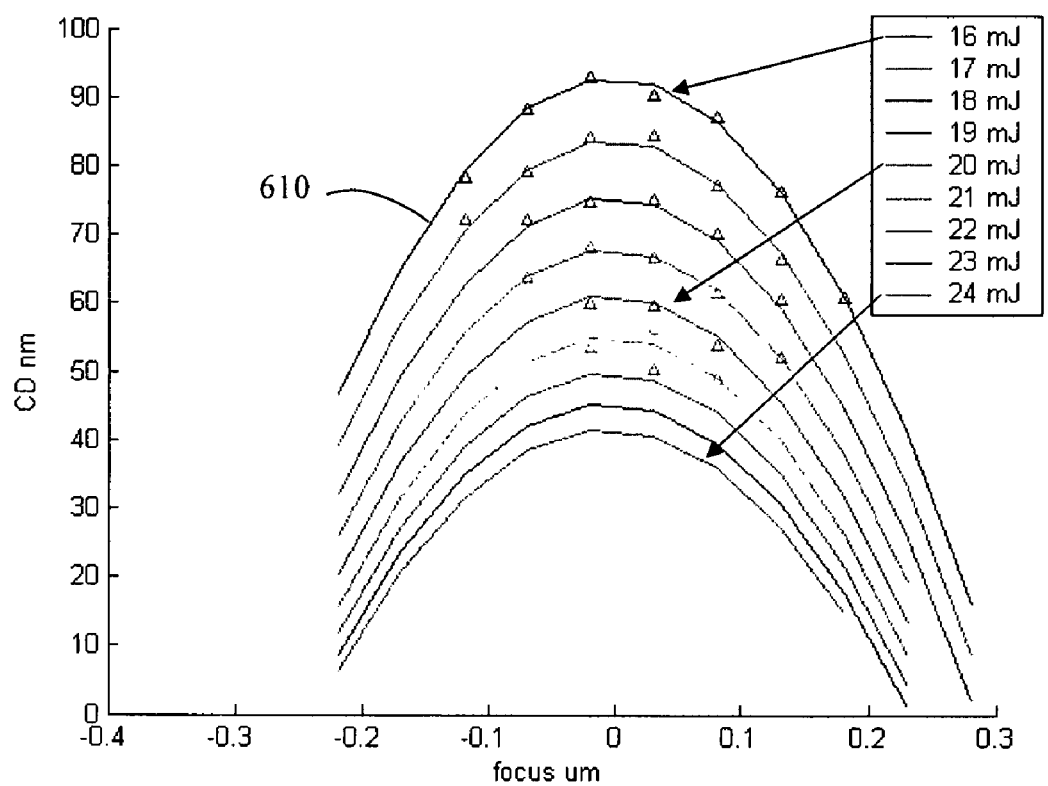
FIG. 6 illustrates a set of Bossung curves representing predicted critical dimension dependence on exposure dose and focus obtained using a prediction technique according to an embodiment of the present invention and the critical dimension data of FIG. 4.

FIG. 6 shows the result of a fitting of data to a model in accordance with an embodiment of the present invention. An additive response F({X}) is included in the CD response model, and the Bossung curves 610 represent Bossung curves in accordance with the apparatus-impact characteristic part given by CD(E,F) (see Equation (8)). From a comparison with the Bossung curves 510, it is appreciated that the process impact is substantial. The Bossung curves 510 in FIG. 5 are relatively flat due to circularly symmetric process effects (such as due to a radial change of resist thickness). Such a process fingerprint obscures the actually parabolic shape of the actual CD(E,F) curves of constant exposure dose, i.e., the Bossung curves 610. Consequently, any exposure dose and focus setting adjustments to control CD during an exposure process based on data represented by the curves 610 are of improved accuracy over the same adjustments based on data represented by curves 510.

A deviation from nominal critical dimension may be caused by properties of the substrate, substrate pre- and post exposure processes, as well as properties of the patterning device. Impact on printed CD due to these properties are referred to as intra-substrate CD effects. An intra-substrate CD effect is conventionally established by measuring printed CD, for example from resist profiles of CD-sized features, which were printed using a lithographic projection exposure apparatus operated at a specific, single setting {$E_0$,$F_0$} of exposure dose $E_0$ and best-focus setting $F_0$. A CD response model CD({X}) like the model of Equation (6) is used, however the terms with coefficients $C_{a;ij}$ are either absent or may include a patterning device coordinate dependence in a multiplicative way (so that the coefficients $C_{a;ij}$ are functions of patterning device coordinates). In contrast to an embodiment of the present invention, apparatus impact on CD can not be separated out from measurement data when measured or obtained with the aid of such measurement techniques. The obtained information can, however, be used to investigate sources of CD error due to process-impact.

According to another embodiment, a response of CD to any perturbation $P_a$ of selected apparatus setting changes such as setting changes $CH_E$ and $CH_F$ of respectively exposure dose setting and focus setting are included in the CD response model of the previous embodiment. For example, a model $CD(P_{a;E}, P_{a;F}, E, F, \{X\})$ to account for possible effective perturbations $P_{a;E}$ and $P_{a;F}$ of the respective exposure dose and focus settings $E=CH_E+E_0$ and $F=CH_F+BF$ is provided. Such a model may be given by $$CD(P_{a;E}, P_{a;F}, E, F, \{X\}) = \sum_{p,q}^{P,Q} C_{pca;pq} P_{a;E}^p P_{a;F}^q + \sum_{u,v}^{U,V} C_{w;uv} x_w^u y_w^v + \sum_{i,j}^{I,J} C_{a;ij} CH_E^i CH_F^j, \quad (10)$$

where the powers p and q run from zero to respective preselected values P and Q. The apparatus model parameters $C_{pca;pq}$ are previously fitted model parameters, and the fitting of measured CD data to the model involves varying the perturbations $P_{a;E}$ and $P_{a;F}$ instead of the coefficients $C_{pca;pq}$ in combination with varying the other model parameters $C_a$ and $C_w$. The incorporation of a perturbation of effective exposure dose may, for example, account for possible changes of exposure dose caused by scanning movement errors in a scanner apparatus during exposure. A fitting of the model given by Equation (10) to measured CD data can be repeated to obtain an improved estimate for the coefficients $C_{pca;pq}$.

In a further embodiment, the method is not limited to the control of critical dimension and the modeling of critical dimension. It is appreciated that the method may in an analogous way be applied to modeling of any other lithographic feature characteristic and subsequent control of the characteristic by means of modifying apparatus impact on the characteristic. For example, the method may be applied to modeling and controlling side wall angle of CD-sized features. Also in this case the variation across the substrate may have an additive effect on predefined offsets.

Similarly, the method is not limited to modeling an impact of changes of exposure dose setting and focus setting. Apparatus-impact on a characteristic of a printed feature may be obtained by changes of, for example, illumination settings such as σ-outer and σ-inner, settings affecting the spectral intensity distribution of the beam of radiation used for projecting an image of a patterning device pattern, settings affecting the pulse shape of pulsed beams of radiation, projection system settings such as numerical aperture NA, and the group of positional and orientation settings of the patterning device, of one or more optical elements of the projection system and of the substrate.

In the present embodiment, a response model FR which represents the response of a printed feature characteristic FR to a set of changes $CH_1, \ldots, CH_R$ of a corresponding set of apparatus settings $AS_1, \ldots, AS_R$, where R indicates the total number of settings that are to be used for control of the feature characteristic FR during a lithographic exposure process. As in the previous embodiments, a response model shall be obtained which includes a term representative for apparatus impact and which is separable from terms describing process impact. Hence, in analogy with the previous embodiments, the response model includes an additive response $F(\{X\})$, and is given by $$FR(\{AS_1 + CH_1, \ldots, AS_R + CH_R\}, \{X\}) = \sum_{u,v}^{U,V} C_{w;uv} x_w^u y_w^v + \sum_{i1,\ldots,iR}^{I1,\ldots,IR} C_{a;i1,\ldots,iR} CH_1^{i1}, \ldots, CH_R^{iR} \quad (11)$$

The model may further include, in analogy with Equation (10), a power series expansion of perturbation terms expressing an impact to the characteristic FR of effective errors in the chosen apparatus settings and apparatus setting changes.

Next, a test substrate is coated with a resist layer and subjected to a series of exposures at a corresponding series of different combinations of any of the setting changes $CH_1, \ldots, CH_R$, and after processing the exposed test substrate measurement data for the feature characteristic FR are collected and stored. Then, the model as given by Equation (10) is fitted using a model-parameter fitting to the measured printed responses FR for the different combinations of setting changes. As in the previous embodiments the values of the $x_w, y_w$ coordinates of test patterns on the substrate and used for the measurements are included in the fitting. The fitted values of the model coefficients in Equation (11) are stored and serve as basis for a control algorithm which calculates desired values of the setting changes $CH_1, \ldots, CH_R$ for control of the feature characteristic FR during a production run of the lithographic process.

In a further embodiment, which is the same as any of the previous embodiments, the procedure to fit the model to measured response data is facilitated by arranging each change of apparatus setting, such as the changes $CH_E$ and $CH_F$ mentioned above, in a random or pseudo random relation to any of the positions on the substrate where a test pattern 100 or test pattern module TPM for measuring feature response data is exposed, as schematically indicated in FIG. 4. Such a random or pseudo-random spatial arrangement of exposures executed with preselected setting changes avoids or minimizes a correlation with the presence of other process-related sources of feature response error. As a consequence, the accuracy of the fitting procedure may be enhanced.

Figure 7:
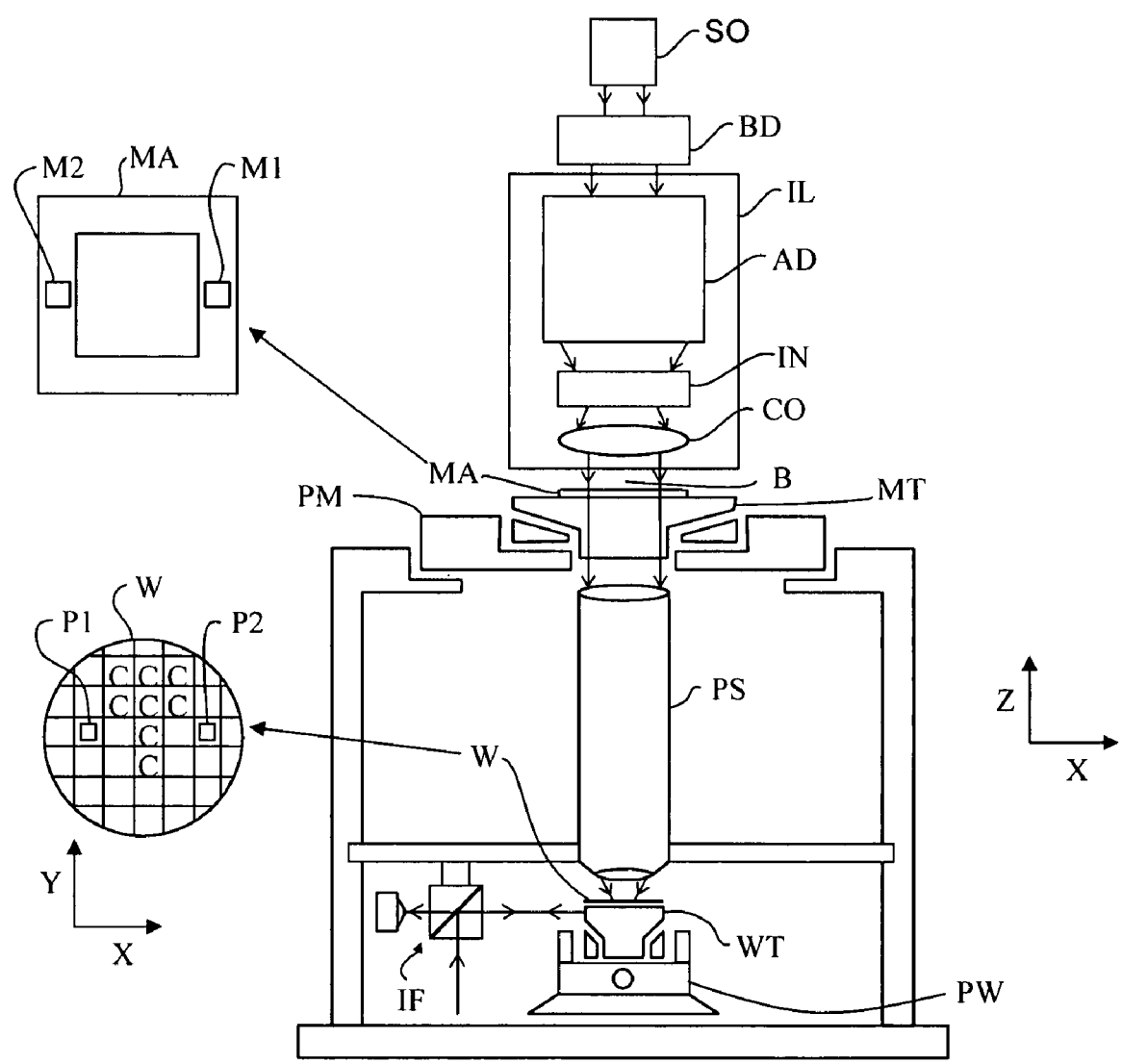
FIG. 7 depicts a lithographic apparatus according to an embodiment of the invention.

FIG. 7 schematically depicts a lithographic apparatus according to the embodiments of the invention. The apparatus comprises:

- an illumination system (illuminator) IL configured to condition a radiation beam B (e.g. UV radiation or DUV radiation such as for example generated by an excimer laser operating at a wavelength of 193 nm or 157 nm, or EUV radiation as generated, for example, by a laser-fired plasma source operating at 13.6 nm).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 7, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 7) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising using a lithographic apparatus to transfer a pattern from a patterning device onto a surface of a substrate to provide a pattern of features on the substrate, the method comprising:
    calculating a change of at least one setting of one or more apparatus settings based on a model of a response of a feature characteristic to changes of any of the one or more apparatus settings; and
    applying the at least one change of setting to the lithographic apparatus,
    wherein the model includes an additive response-model term expressing a spatial variability of the response of the feature characteristic with respect to the surface of the substrate.

2. The method of claim 1, wherein the feature characteristic is a critical dimension of the feature.

3. The method of claim 2, wherein the change of at least one setting includes a change of setting of exposure dose setting for exposing the substrate, focus setting of the substrate, or exposure dose setting and focus setting.

4. The method of claim 3, wherein the one or more apparatus settings include exposure dose setting and focus setting.

5. The method of claim 2, wherein the calculating comprises:
    measuring a critical dimension response, and
    fitting the model using fitting predicted critical dimension response to the measured critical dimension response.

6. The method of claim 5, wherein the fitting comprises varying model parameters which relate critical dimension to the change of at least one setting.

7. The method of claim 6, wherein the fitting further comprises varying model parameters which relate critical dimension to the spatial variability of the response.

8. The method of claim 5, wherein the measuring critical dimension includes measuring at a plurality of exposure settings.

9. The method of claim 8, wherein the measuring further comprises measuring at a plurality of focus settings for one or more of the exposure settings of the plurality of exposure settings.

10. The method of claim 8, wherein the measuring further comprises measuring at a plurality of positions on the substrate to express a spatial variability of the response with respect to the substrate.

11. The method of claim 10, wherein the measuring at a plurality of positions includes measuring at different positions in respective different target portions.

12. The method of claim 10, wherein the measuring at a plurality of positions includes measuring at different positions in a single target portion.

13. The method of claim 10, wherein the measuring at a plurality of positions includes measuring at different positions in respective different target portions and measuring at different positions in a single target portion.

14. The method of claim 10, wherein each of the changes of the at least one setting is arranged in a random relation to or a pseudo-random relation to the plurality of positions.

15. The method of claim 1, wherein the change of the at least one setting includes a change of setting of an illumination setting, a σ-outer setting, a σ-inner setting, a spectral intensity distribution setting of a beam of radiation for transferring a pattern onto the substrate, a projection system element setting, a setting of numerical aperture NA, a position setting of the patterning device, or a position setting of the substrate.

16. A computer program product embodied in a storage medium comprising program code to control a lithographic apparatus to perform a method comprising:
  calculating a change of at least one setting of one or more apparatus settings based on a model of a response of a feature characteristic to changes of any of the one or more apparatus settings; and
  applying the at least one change of setting to the lithographic apparatus,
  wherein the model includes an additive response-model term expressing a spatial variability of the response of the feature characteristic with respect to the surface of the substrate.

17. The computer program product of claim 16, wherein the calculating a change includes calculating the change of at least one apparatus setting of the group of apparatus settings comprising exposure dose setting for exposing a substrate and a focus setting of the substrate.

18. The computer program product of claim 17, wherein the feature characteristic is a critical dimension of a feature.

19. The computer program product of claim 16, wherein the calculating comprises:
  measuring a critical dimension response, and
  fitting predicted critical dimension response to the measured critical dimension response.

20. The computer program product of claim 19, wherein the fitting comprises varying model parameters which relate critical dimension to the change of at least one setting.

* * * * *